United States Patent

Landry et al.

[11] Patent Number: 6,088,289
[45] Date of Patent: Jul. 11, 2000

[54] CIRCUIT AND METHOD FOR CONTROLLING A WORDLINE AND/OR STABILIZING A MEMORY CELL

[75] Inventors: Greg J. Landry, Merrimack; Peter Adamek, Nashua, both of N.H.

[73] Assignee: Cypress Semiconductor Corp., San Jose, Calif.

[21] Appl. No.: 09/405,950

[22] Filed: Sep. 27, 1999

[51] Int. Cl.$^7$ .................................................. G11C 8/00
[52] U.S. Cl. .................................. 365/230.06; 365/202
[58] Field of Search .......................... 365/230.06, 202, 365/227; 326/105, 106, 108

[56] References Cited

U.S. PATENT DOCUMENTS

| | | | |
|---|---|---|---|
| 4,751,683 | 6/1988 | Wada et al. | 365/230 |
| 5,268,863 | 12/1993 | Bader et al. | 365/189.01 |
| 5,343,432 | 8/1994 | Matsuo et al. | 365/203 |
| 5,434,824 | 7/1995 | Matsuzaki | 365/233.5 |
| 5,438,548 | 8/1995 | Houston | 365/227 |
| 5,719,812 | 2/1998 | Seki et al. | 365/194 |
| 5,761,148 | 6/1998 | Allan et al. | 365/230.06 |
| 5,774,413 | 6/1998 | Hunt | 365/230.06 |
| 5,825,715 | 10/1998 | Rezeanu | 365/233.5 |
| 5,875,149 | 2/1999 | Oh et al. | 365/230.06 |
| 5,889,728 | 3/1999 | Rezeanu | 365/233.5 |
| 5,894,442 | 4/1999 | Okamura | 365/203 |
| 5,896,334 | 4/1999 | Casper et al. | 365/202 |
| 5,909,407 | 6/1999 | Yamamoto et al. | 365/189.05 |
| 5,920,510 | 7/1999 | Yakutake et al. | 365/194 |
| 5,936,894 | 8/1999 | Hawkins et al. | 365/189.06 |
| 5,940,337 | 8/1999 | Jiang | 365/203 |
| 5,986,942 | 11/1999 | Sugibayashi | 365/189.01 |

*Primary Examiner*—Son Mai
*Attorney, Agent, or Firm*—Christopher P. Maiorana, P.C.; Robert M. Miller

[57] ABSTRACT

A circuit and method for controlling a wordline and/or stabilizing a memory cell comprising a first circuit and a second circuit. The first circuit may be configured to generate a control signal in response to (i) a select signal and (ii) an equalization signal. The second may be configured to generate an output signal in response to (i) the control signal and (ii) a global wordline signal. The output signal may be presented to one or more memory cells of a memory array.

18 Claims, 2 Drawing Sheets

CIRCUIT AND METHOD FOR CONTROLLING A WORDLINE AND/OR STABILIZING A MEMORY CELL

FIELD OF THE INVENTION

The present invention relates to a memory cell generally and, more particularly, to a circuit and method for controlling a wordline and or stabilizing a memory cell.

BACKGROUND OF THE INVENTION

In memory devices, equalization circuits are used to pre-charge bitlines and data lines. Equalization circuits are also used to automatically power down circuitry after a cycle is completed in order to save power (i.e. the wordline may be switched off after a read access if the data is stored in a register).

Traditional uses of equalization circuits allow pre-charge of the data path, and automatic power down after the completion of a cycle. However, during equalization, the memory cell is "fighting" against the equalization circuitry on the bitlines. Such fighting can cause a "crow-bar" current as high as several mA during the equalization time period. Second, should the address change cause a new wordline to be selected before equalization has pulled the bitlines to a high enough level, the contents of the newly selected cell can be overwritten. Such a condition is known as read disturb or write disturb (depending on the cycle that causes the problem). The use of a register in the data path so that the wordlines can be turned off after a read cycle, creates an additional critical timing relationship. The register must be clocked during the time when correct data is available from the memory cell no matter what the relationship of the address signals. This can be a difficult condition to satisfy over all process corners, voltages, and temperatures.

SUMMARY OF THE INVENTION

The present invention concerns a circuit and method for controlling a wordline and/or stabilizing memory cells comprising a first circuit and a second circuit. The first circuit may be configured to generate a control signal in response to a select signal and an equalization signal. The second circuit may be configured to generate a local wordline signal in response to (i) the control signal and (ii) a global wordline signal. The output signal may be presented to one or more memory cells of a memory array.

The objects, features and advantages of the present invention include providing an apparatus that may (i) simplify address timing relative to bitline pre-charge, (ii) use an equalization signal to disable the address path, (iii) force all local wordlines off during equalization, (iv) prevent read and/or write disturb during bitline equalization, (v) reduce power consumption due to "crow-bar" current from the bitline pre-charge circuitry and the memory cells, (vi) reduce DC power consumed by allowing the bitlines to split to full CMOS levels, and/or (vii) be implemented in asynchronous and/or synchronous devices.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
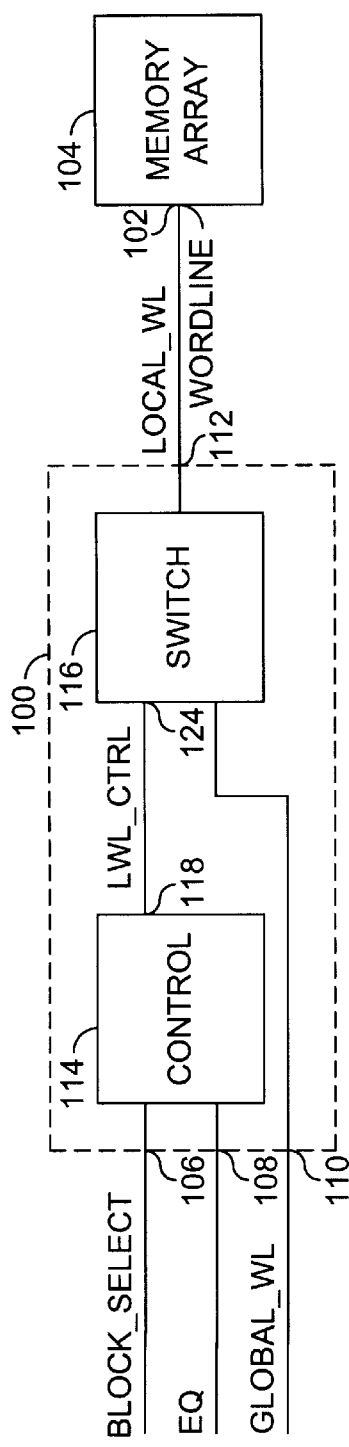
FIG. 1 is a block diagram illustrating a preferred embodiment of the present invention.

Referring to FIG. 1, a block diagram of a circuit 100 is shown in accordance with a preferred embodiment of the present invention. The circuit 100 may be implemented, in one example, as a wordline control circuit. The circuit 100 may be implemented on each wordline 102 of a memory array 104. The circuit 100 may have an input 106, an input 108, an input 110, and an output 112. A block select signal (e.g., BLOCK_SELECT) may be presented to the input 106. An equalization signal (e.g., EQ) may be presented to the input 108. For example, in an asynchronous memory application, the signal EQ may be an address transition detection signal. A global wordline signal (e.g., GLOBAL_WL) may be presented to the input 110. The circuit 100 may be configured to generate a local wordline signal (e.g., LOCAL_WL) at the output 112 in response to (i) the signal BLOCK_SELECT, (ii) the signal EQ, and (iii) the signal GLOBAL_WL.

The circuit 100 generally comprises a circuit 114 and a circuit 116. The circuit 114 may be, in one example, a control circuit. The circuit 116 may be, in one example, a switching circuit. The circuit 114 may be configured to receive the signal BLOCK_SELECT and the signal EQ. The circuit 114 may be configured to generate a control signal (e.g., LWL_CTRL) at an output 118 in response to the signal BLOCK_SELECT and the signal EQ.

Figure 2:
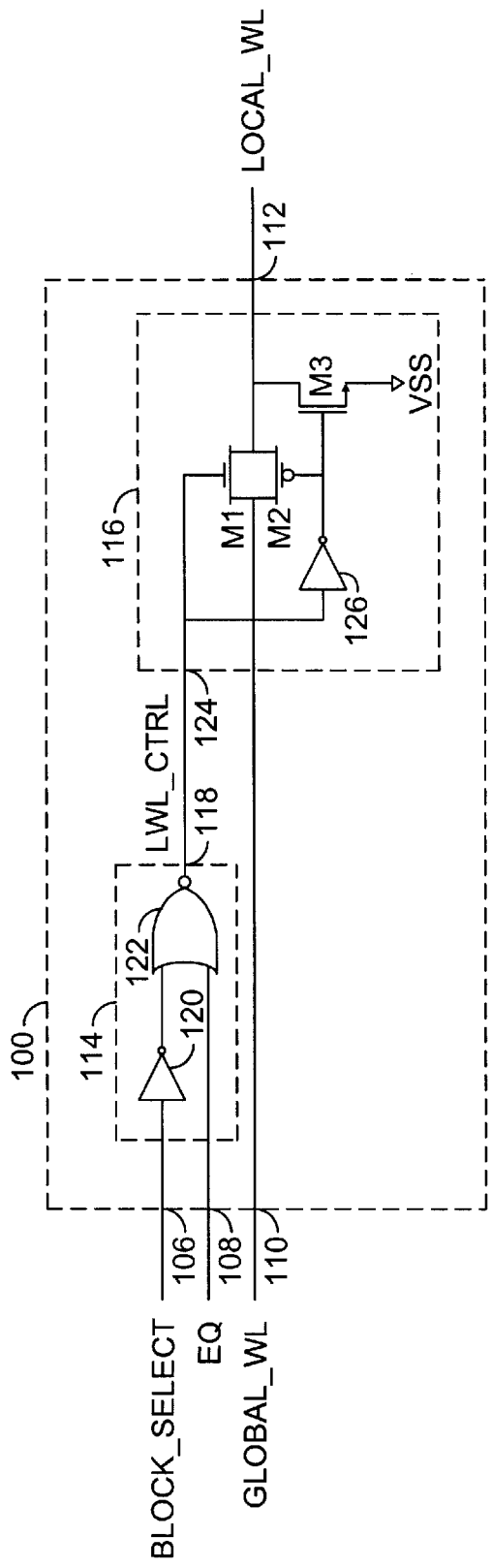
FIG. 2 is a detailed circuit diagram of the circuit of FIG. 1.

Referring to FIG. 2, a more detailed diagram of the circuit 100 is shown. The circuit 114 generally comprises a gate 120 and a gate 122. The gate 120 may be implemented, in one example, as an inverter. However, other types of gates may be implement accordingly to meet the design criteria of a particular application. The signal BLOCK_SELECT is generally presented to an input of the gate 120. An output of the gate 120 is generally connected to a first input of the gate 122. The gate 122 may be implemented, in one example, as a two input NOR gate. However, other types of gates may be implement accordingly to meet the design criteria of a particular application. The signal EQ is generally presented to a second input of the gate 122. The gate 122 generally presents the signal LWL_CTRL as an output.

The circuit 116 may be configured to generate the signal LOCAL_WL in response to (i) the signal LWL_CTRL at an input 124, and (ii) the signal GLOBAL_WL from the input 110. The circuit 116 generally comprises a gate 126, a transistor M1, a transistor M2, and a transistor M3. The gate 126 may be implemented, in one example, as an inverter. The transistors M1, M2, and M3 may be implemented, in one example, as one or more MOSFET transistors. The transistors M1 and M3 may be implemented, in one example, as NMOS transistors. The transistor M2 may be implemented, in one example, as a PMOS transistor. However, other types of transistors may be implemented accordingly to meet the design criteria of a particular application.

The signal LWL_CTRL is generally presented to an input of the gate 126 and a gate of the transistor M1. A source of the transistor M1 is generally connected to a drain of the transistor M2. A drain of the transistor M1 is generally connected to (i) a source of the transistor M2 and (ii) a drain of the transistor M3. The transistor M1 and the transistor M2 may be implemented, in one example, as a CMOS transmission gate. An output of the gate 126 is generally connected to a gate of the transistor M2 and a gate of the transistor M3. A source of the transistor M3 is generally connected to a ground voltage (e.g., VSS). The transistor M3 may be implemented, in one example, as a pull-down transistor. The signal GLOBAL_WL is generally presented to a node formed by the connection of the source of the transistor M1 and the drain of the transistor M2. The signal LOCAL_WL is generally output at a node formed by the connection of the drain of the transistor M1, the source of the transistor M2, and the drain of the transistor M3.

Figure 3:
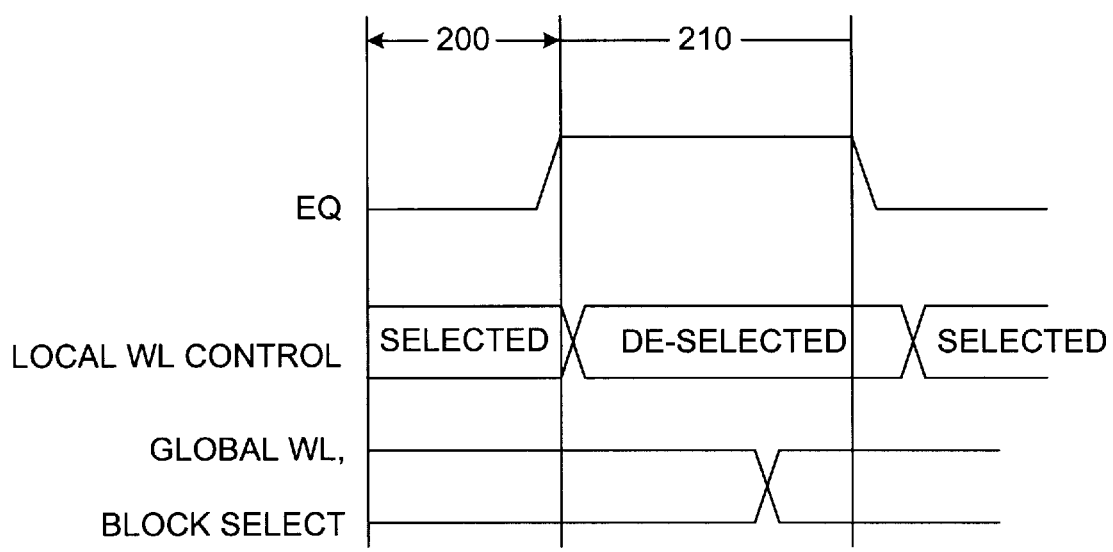
FIG. 3 is a timing diagram illustrating various signals of the circuit of FIG. 2.

Referring to FIG. 3, a timing diagram illustrating the various signals of the circuit 100 is shown. When the signal EQ is in a first logic state (e.g., an inactive state or a digital LOW), as shown in a portion 200, the signal BLOCK_SELECT and the signal GLOBAL_WL are generally allowed to pass to the local wordline and normal operation occurs. When the signal EQ is in a second logic state (e.g., an active state or a digital HIGH), as shown in a portion 210, transitions of the signal GLOBAL_WL and the signal BLOCK_SELECT are blocked from affecting the local wordline.

The circuit 100 generally uses the signal EQ to force all local wordlines LOW by generating a logical combination of the signal EQ and the signal BLOCK_SELECT prior to the local wordline decode circuitry. When the signal EQ is HIGH, any transitions of the signal GLOBAL_WL and the signal BLOCK_SELECT are generally ignored. When the signal EQ is LOW (e.g., after a pre-charge is completed), the signal BLOCK_SELECT and the signal GLOBAL_WL are generally passed to the local wordline for normal operation.

The use of the signal EQ to disable the local wordlines and pre-charge the bitlines will generally prevent the memory cell from being disturbed during the pre-charge phase of the cycle. By using the signal EQ to control the wordlines, the timing of the signal BLOCK_SELECT and the signal GLOBAL_WL is generally simplified. As long as the signal BLOCK_SELECT and the signal GLOBAL_WL switch at any time during the active period of the signal EQ, the memory cell will generally operate as desired. The switching of the signal BLOCK_SELECT and the signal GLOBAL_WL during the active period of the signal EQ is generally a much easier condition to satisfy than requiring that the local wordline for the next address does not switch HIGH until (i) the local wordline for the current address has switched LOW and (ii) the bitlines have been pre-charged to a safe level by the signal EQ.

The use of the signal EQ to control the local wordlines may reduce AC power. While the bitlines are being pulled HIGH by the signal EQ in a traditional equalization circuit usage, the active memory cells in the memory array 104 are generally trying to pull one of each pair of bitlines LOW. A transient current is generally created. On a block of cells in the memory array 104 where the signal EQ is used to pre-charge the bitlines, the transient current may be as much as 200 uA per column, and may last for about 1 ns. In one example, where the block of cells in the memory array 104 is generally operating at a frequency of about 250 mHz, and generally has 8 memory cells enabled at any given time, a reduction of 400 uA (200 uA×8×1 ns/4 ns) may be realized. This reduction represents approximately 3% of the total power consumed by the block of cells in the memory array 104.

A further benefit of using the signal EQ to control the wordlines is that the bitlines may split full rail without making read disturb difficult to control. By allowing the bitlines to split to full CMOS levels, power is generally reduced under DC conditions. The use of the signal EQ to control the wordlines may allow a circuit with no DC power (except for leakage) without the difficulty and/or risk of having to register the output data later on in the path.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate a control signal in response to (i) a select signal and (ii) an equalization signal; and
   a second circuit configured to generate an output signal in response to (i) said control signal and (ii) a global wordline signal, wherein said output signal is presented to one or more memory cells of a memory array.

2. The apparatus according to claim 1, wherein said select signal is a block select signal.

3. The apparatus according to claim 1, wherein said output signal is a wordline signal.

4. The apparatus according to claim 3, wherein said output signal is a local wordline signal.

5. The apparatus according to claim 1, wherein said output signal is presented to a plurality of said memory cells.

6. The apparatus according to claim 1, wherein said apparatus comprises a wordline control circuit.

7. The apparatus according to claim 1, wherein said apparatus is implemented on each wordline of said memory array.

8. The apparatus according to claim 1, wherein said first circuit may be configured to generate said control signal as a logical combination of said select signal and said equalization signal.

9. The apparatus according to claim 1, wherein said second circuit further comprises a pass transistor configured to pass said global wordline signal as said output signal in response to said control signal.

10. The apparatus according to claim 9, wherein said pass transistor is a CMOS transmission gate.

11. The apparatus according to claim 9, wherein said second circuit further comprises a transistor configured to pull said output signal to a predetermined voltage level in response to said control signal.

12. The apparatus according to claim 11 wherein said predetermined voltage level is a ground voltage.

13. An apparatus comprising:
   means for generating a control signal in response to (i) a select signal and (ii) an equalization signal; and
   means for generating an output signal in response to said control signal and a wordline signal, wherein said output signal is presented to one or more memory cells of a memory array.

14. A method for controlling a wordline and/or stabilizing one or more memory cells in a memory array comprising the steps of:
   (A) generating a control signal in response to (i) a select signal and (ii) an equalization signal; and
   (B) generating an output signal in response to said control signal and a wordline signal.

15. The method according to claim 14, wherein said select signal is a block select signal.

16. The method according to claim 14, wherein said output signal is a local wordline signal.

17. The method according to claim 14, wherein said step (A) further comprises the sub-steps of:
- (A-1) setting said control signal to a first logic state in response to (i) a first predetermined logic state of said select signal and (ii) a first predetermined logic state of said equalization signal; and
- (A-2) setting said control signal to a second logic state in response to (i) a second predetermined logic state of said select signal or (i) a second predetermined logic state of said equalization signal.

18. The method according to claim 17, wherein said step (B) further comprises the sub-steps of:
- (B-1) when said control signal is in said first logic state, passing said global wordline signal as said output signal; and
- (B-2) when said control signal is in said second logic state, (i) blocking said global wordline signal and (ii) setting said output signal at a predetermined voltage level.

* * * * *